(12) United States Patent  
Dhanasekaran (10) Patent No.: US 10,003,312 B2
(45) Date of Patent: Jun. 19, 2018

(54) AMPLIFIER WITH FEEDBACK CIRCUIT

(71) Applicant: QUALCOMM Incorporated, San Diego, CA (US)

(72) Inventor: Vijayakumar Dhanasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 14/841,490

(22) Filed: Aug. 31, 2015

(65) Prior Publication Data

US 2017/0063315 A1    Mar. 2, 2017

(51) Int. Cl.
| | |
|---|---|
| *H03F 1/34* | (2006.01) |
| *H03F 3/183* | (2006.01) |
| *H03F 3/45* | (2006.01) |
| *H03F 1/56* | (2006.01) |
| *H03F 3/187* | (2006.01) |
| *H04R 3/00* | (2006.01) |

(52) U.S. Cl.
CPC ............... *H03F 3/183* (2013.01); *H03F 1/34* (2013.01); *H03F 1/56* (2013.01); *H03F 3/187* (2013.01); *H03F 3/45071* (2013.01); *H03F 3/45475* (2013.01); *H04R 3/00* (2013.01); *H03F 2200/03* (2013.01); *H03F 2200/234* (2013.01); *H03F 2200/387* (2013.01); *H03F 2203/45136* (2013.01); *H03F 2203/45521* (2013.01); *H03F 2203/45522* (2013.01); *H03F 2203/45528* (2013.01); *H04R 2420/03* (2013.01); *H04R 2420/05* (2013.01)

(58) Field of Classification Search
CPC ........................................................ H03F 1/34
USPC ........................................ 330/85, 279, 95, 97
See application file for complete search history.

(56) References Cited

U.S. PATENT DOCUMENTS

| | | | | |
|---|---|---|---|---|
| 4,079,331 | A * | 3/1978 | Pinckaers | H03F 3/087 219/499 |
| 4,135,590 | A * | 1/1979 | Gaulder | H03G 9/02 330/155 |
| 4,223,273 | A | 9/1980 | Yokoyama | |
| 5,856,758 | A | 1/1999 | Joffe et al. | |
| 5,877,612 | A * | 3/1999 | Straw | H03G 1/0088 330/254 |
| 5,917,312 | A * | 6/1999 | Brkovic | H02M 3/156 323/282 |
| 6,625,287 | B1 | 9/2003 | Wurtz | |
| 7,010,131 | B1 | 3/2006 | Rhode et al. | |
| 7,389,087 | B2 * | 6/2008 | Darabi | H03B 21/01 323/237 |
| 7,420,405 | B2 * | 9/2008 | Washburn | H03F 3/45475 327/319 |
| 7,800,441 | B2 * | 9/2010 | Mui | H03F 3/187 330/86 |

(Continued)

OTHER PUBLICATIONS

International Search Report and Written Opinion—PCT/US2016/046859—ISA/EPO—dated Oct. 25, 2016, 11 pages.

*Primary Examiner* — Henry Choe
(74) *Attorney, Agent, or Firm* — Qualcomm Incorporated-Toler (57) ABSTRACT

An apparatus includes a resistor having an input coupled to an output of an amplifier. The apparatus also includes a feedback circuit coupled to an output of the resistor and to an input of the amplifier. The feedback circuit includes a first component of a voltage divider.

18 Claims, 7 Drawing Sheets

(56) References Cited

U.S. PATENT DOCUMENTS

| | | | |
|---|---|---|---|
| 8,203,385 B2 | 6/2012 | Kasha et al. | |
| 8,217,717 B1* | 7/2012 | Bui | G01R 21/10 330/140 |
| 8,755,544 B2 | 6/2014 | Zhen et al. | |
| 8,958,575 B2 | 2/2015 | Chilakapati et al. | |
| 2006/0273851 A1* | 12/2006 | Stein | H03F 3/68 330/69 |
| 2012/0119821 A1 | 5/2012 | Den Besten | |
| 2014/0152390 A1* | 6/2014 | McMorrow | H03F 1/0261 330/295 |

* cited by examiner

AMPLIFIER WITH FEEDBACK CIRCUIT

I. FIELD

The present disclosure is generally related to electronics, and more specifically to amplifiers.

II. DESCRIPTION OF RELATED ART

Linear distortion in audio amplifiers is reduced when an output resistance of the audio amplifier matches the resistance of a speaker that is driven by the audio amplifier. Typically, a series resistor is added at the output of the audio amplifier. The series resistor has a resistance that matches an expected resistance of a speaker that may be coupled to the audio amplifier. However, adding a series resistor at the output of the audio amplifier reduces an amount of voltage that is provided to the speaker. In addition, power loss occurs due to the added resistance, impacting battery life of a device that includes the audio amplifier. Also, because headphone speaker resistance varies across manufacturers and product lines, a series resistance value that is selected for use with a particular headphone product may provide reduced performance when the audio amplifier is used with other headphone products.

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
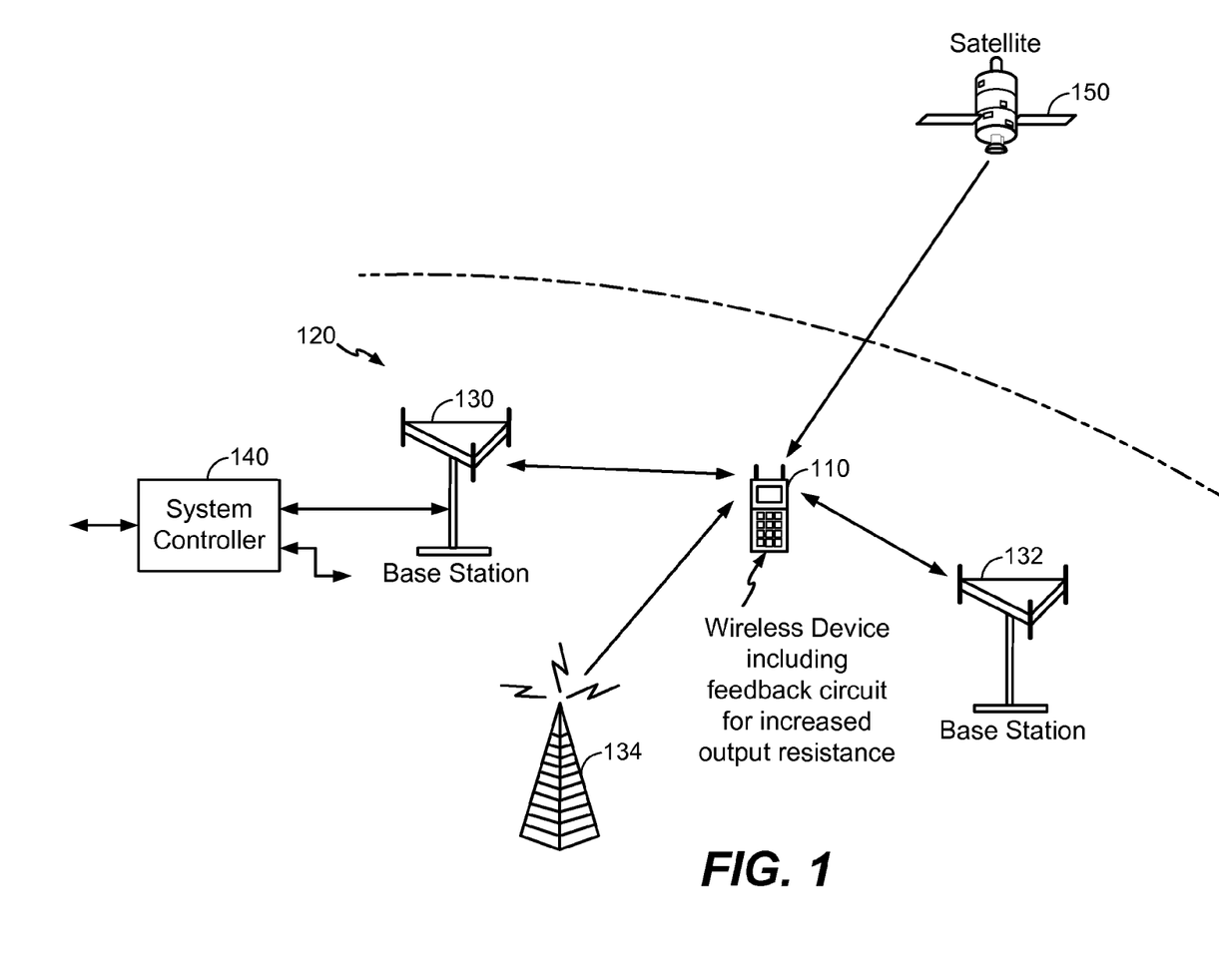
FIG. 1 shows a wireless device that includes an audio amplifier with a feedback circuit for increased output resistance, the wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Furthermore, in an exemplary embodiment, the wireless device 110 may include an amplifier, such as an audio amplifier. The amplifier includes a resistor coupled to an amplifier output and a feedback circuit that includes a first component of a voltage divider. The feedback circuit causes an output resistance of the amplifier to exceed the resistance of the resistor. As described in further detail with respect to FIGS. 2-6, using the feedback circuit to increase the output resistance enables load matching for loads with resistances larger than the resistor without the increased voltage drop and power loss associated with using a larger resistor at the output of the amplifier.

Figure 2:
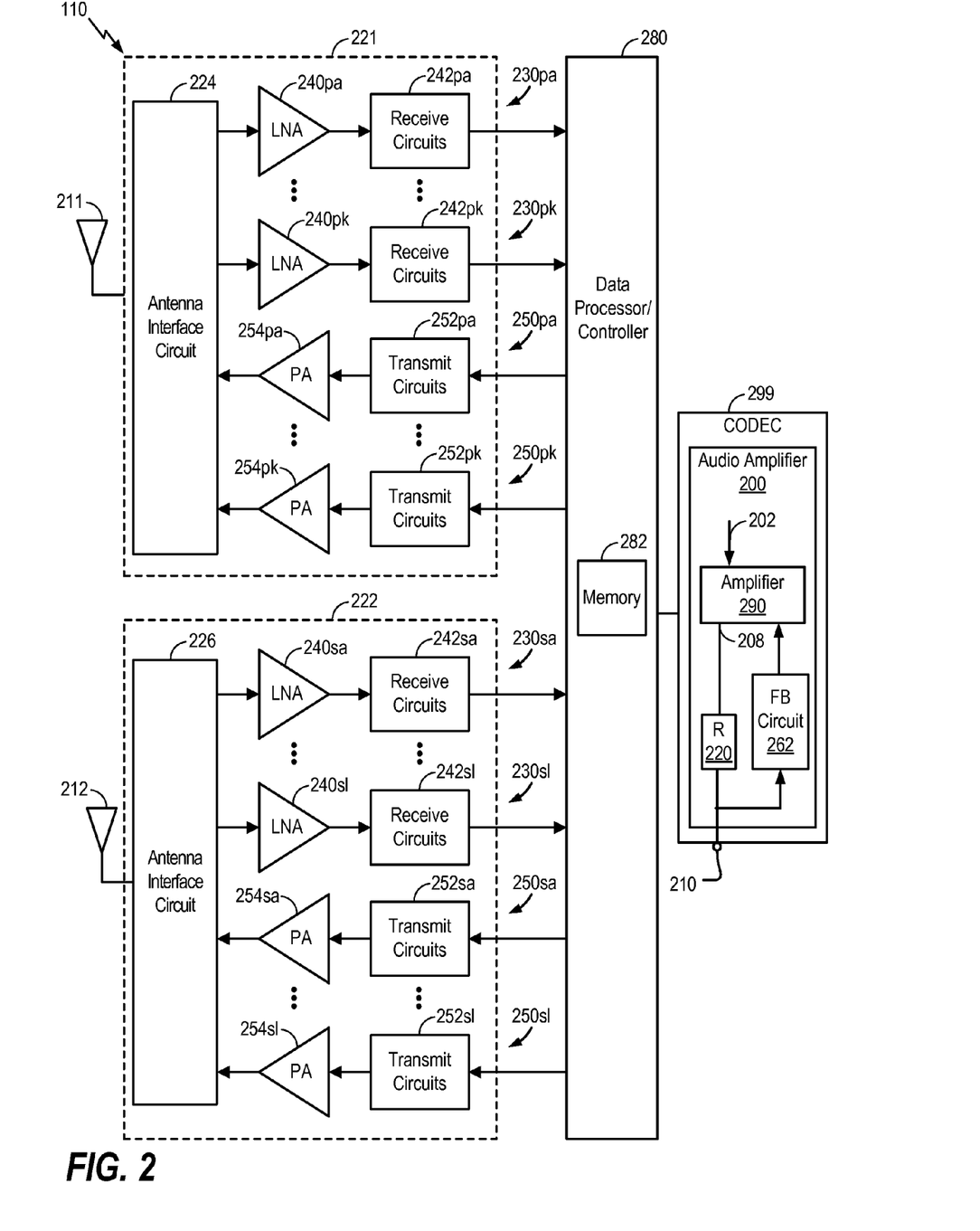
FIG. 2 shows a block diagram of the wireless device in FIG. 1 that includes an audio amplifier with a feedback circuit for increased output resistance.

FIG. 2 shows a block diagram of an exemplary design of wireless device 110 in FIG. 1. In this exemplary design, wireless device 110 includes an audio amplifier 200 that includes an amplifier 290 coupled via a resistor 220 to an output port 210. The audio amplifier 200 includes a feedback circuit 262 that enables the audio amplifier 200 to have an output resistance that is larger than the resistance of the resistor 220. The audio amplifier 200 is included in a coder/decoder (CODEC) 299 that is coupled to a data processor/controller 280. The wireless device 110 also includes a transceiver 221 coupled to the data processor/controller 280 and a transceiver 222 coupled to the data processor/controller 280. The transceiver 221 is coupled to a primary antenna 211 via an antenna interface circuit 224, and the transceiver 222 is coupled to a secondary antenna 212 via an antenna interface circuit 226.

Transceiver 221 includes multiple (K) receivers 230pa to 230pk and multiple (K) transmitters 250pa to 250pk to support multiple frequency bands, multiple radio technologies, carrier aggregation, etc. Transceiver 222 includes multiple (L) receivers 230sa to 230sl and multiple (L) transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230pa to 230pk and 230sa to 230sl includes one of the LNAs 240pa to 240pk or 240sa to 240sl and one of the receive circuits 242pa to 242pk or 242sa to 242sl. For data reception, antenna 211 receives signals from base stations and/or other transmitter stations and outputs a received RF signal, which is routed through the antenna interface circuit 224 and presented as an input RF signal to one or more of the receivers 230pa to 230pk and 230sa to 230sl, such as via a first input signal path to receiver 230pa or via a second input signal path to receiver 230pk. Antenna interface circuit 224 may include switches, duplexers, transmit filters, receive filters, matching circuits, etc.

The description below assumes that receiver 230pa is selected to receive an RF signal. The RF signal received from the antenna 211 via the antenna interface circuit 224 is sent to the LNA 240pa. Receive circuits 242pa downconvert the output RF signal that is output by the LNA 240pa from RF to baseband, amplify and filter the downconverted signal, and send an analog input signal to data processor/controller 280. Receive circuits 242pa may include mixers, filters, amplifiers, matching circuits, an oscillator, a local oscillator (LO) generator, a phase locked loop (PLL), etc. Although operation of receiver 230pa is described, it should be understood that each of the receivers 230pa to 230pk and 230sa to 230sl in transceivers 221 and 222 may operate in a similar manner.

In the exemplary design shown in FIG. 2, each of the transmitters 250pa to 250pk and 250sa to 250sl includes one of the transmit circuits 252pa to 252pk and 252sa to 252sl and one of the power amplifiers (PAs) 254pa to 254pk and 254sa to 254sl. For data transmission, data processor/controller 280 processes (e.g., encodes and modulates) data to be transmitted and sends an analog output signal to a selected transmitter. The description below assumes that transmitter 250pa is the selected transmitter. Within transmitter 250pa, transmit circuits 252pa amplify, filter, and upconvert the analog output signal from baseband to RF to generate a modulated RF signal. Transmit circuits 252pa may include amplifiers, filters, mixers, matching circuits, an oscillator, an LO generator, a PLL, etc. A PA 254pa receives and amplifies the modulated RF signal and sends a transmit RF signal having the proper output power level. The transmit RF signal is routed through antenna interface circuit 224 and transmitted via antenna 211. Although operation of transmitter 250pa is described, it should be understood that each of the transmitters 250pa to 250pk and 250sa to 250sl in transceivers 221 and 222 may operate in a similar manner.

FIG. 2 shows an exemplary design of receivers 230pa to 230pk and 230sa to 230sl and transmitters 250pa to 250pk and 250sa to 250sl. A receiver and a transmitter may also include other circuits not shown in FIG. 2, such as filters, matching circuits, etc. All or a portion of transceivers 221 and 222 may be implemented on one or more analog integrated circuits (ICs), RF ICs (RFICs), mixed-signal ICs, etc. For example, LNAs 240pa to 240pk and 240sa to 240sl and receive circuits 242pa to 242pk and 242sa to 242sl may be implemented on one RFIC.

Data processor/controller 280 may perform various functions for wireless device 110. For example, data processor/controller 280 may perform processing for data being received via receivers 230pa to 230pk and 230sa to 230sl and data being transmitted via transmitters 250pa to 250pk and 250sa to 250sl. Data processor/controller 280 may control the operation of the various circuits within transceivers 221 and 222. A memory 282 may store program code and data for data processor/controller 280. Data processor/controller 280 may be implemented on one or more application specific integrated circuits (ASICs) and/or other ICs.

The CODEC 299 is coupled to the data processor/controller 280, and the CODEC 299 includes the audio amplifier 200 (e.g., a headphone amplifier) coupled to the output port 210. The CODEC 299 may be configured to receive a digital audio signal from the data processor/controller 280 and to convert the digital audio signal into an analog audio signal. For example, the digital audio signal may correspond music data from an audio file that is processed by the data processor/controller 280. The audio amplifier 200 may be configured to connect to one or more headphones or external speakers via the output port 210, and the analog audio signal may be output to the audio amplifier 200 to power headphones or other external speakers that are coupled to the output port 210, enabling playback of the music data from the audio file via the headphones or other external speakers.

The amplifier 290 is responsive to an input signal (e.g., the analog audio signal corresponding to the music data from the audio file) at an input 202 of the amplifier 290. The amplifier 290 provides an amplified signal at the output 208. The amplified signal is provided via the serially-coupled resistor 220 to the output port 210, such as an audio signal that is amplified to power headphones or other external speakers. The feedback circuit 262 may include a first component of a voltage divider (e.g., any circuit that produces an output voltage that is a fraction of its input voltage), such as described with respect to FIGS. 4-6. The feedback circuit 262 enables the output resistance of the audio amplifier 200 at the output port 210 to be larger than a resistance of the resistor 220, emulating a larger resistor that provides a larger output resistance of the audio amplifier 200 for load matching to headphones, external speakers, or another load coupled to the output port 210. Load matching may be achieved without the increased voltage drop and power loss associated with using a larger resistor at the output of the audio amplifier 200, as described in further detail with respect to FIGS. 3-6.

Figure 3:
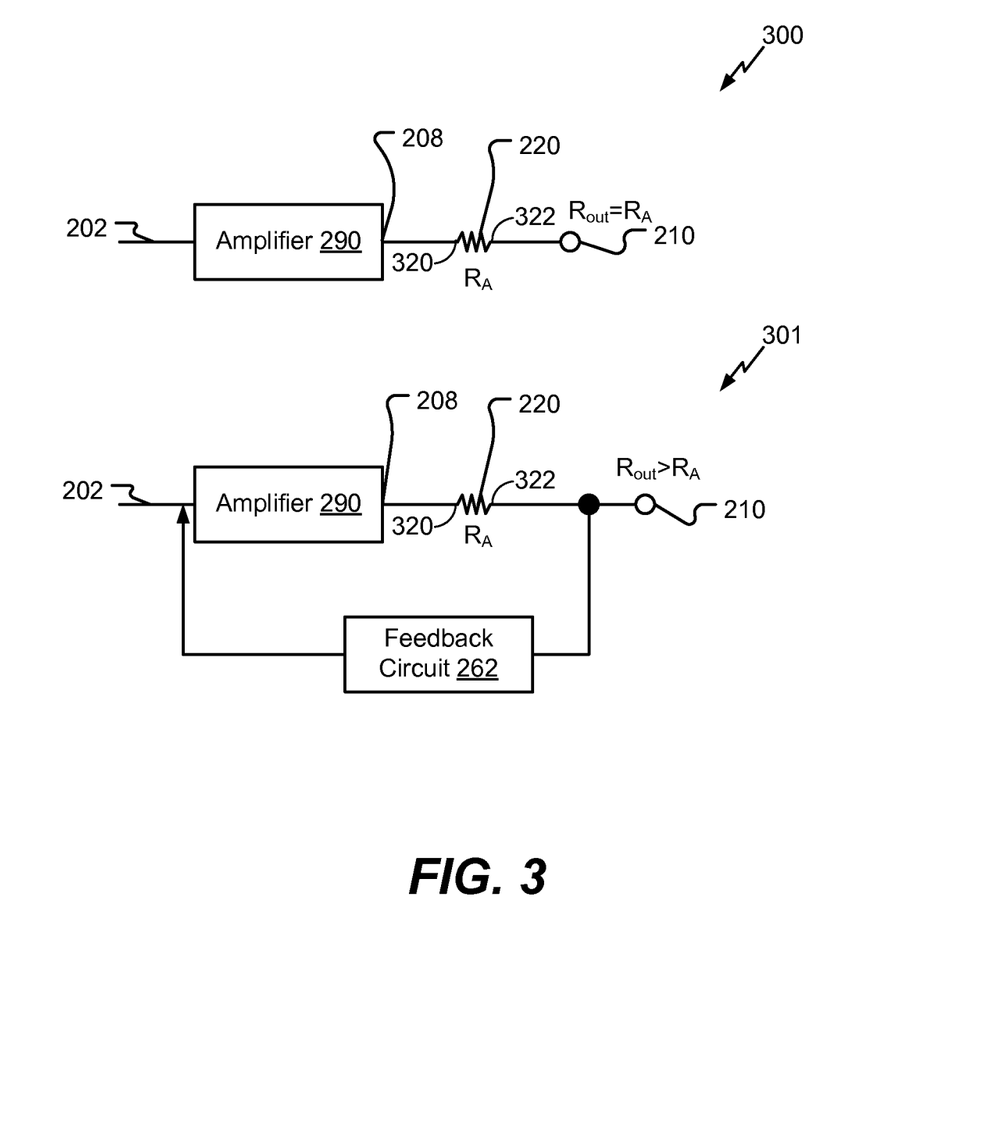
FIG. 3 shows block diagrams of exemplary embodiments of amplifiers including an exemplary embodiment of an amplifier with a feedback circuit for increased output resistance that may be included in the wireless device of FIG. 1.

FIG. 3 illustrates a first exemplary embodiment 300 and a second exemplary embodiment 301 of an amplifier, such as a headphone amplifier. An input 320 of the resistor 220 is coupled to the output 208 of the amplifier 290 of FIG. 2. An output 322 of the resistor 220 is coupled to the output port 210. The amplifier 290 is responsive to an input signal at the input 202 of the amplifier 290 and provides an amplified signal at the output 208. The amplified signal is provided to the output port 210 via the serially-coupled resistor 220.

In the first exemplary embodiment 300, an output impedance $R_{out}$ of the amplifier (e.g., a ratio of a voltage at the output port 210 to a current at the output port 210) may correspond to a resistance $R_A$ of the resistor 220. If a 50 Ohm load (e.g., a headphone speaker) is applied to the output port 210, impedance matching is achieved when the resistance $R_A$ of the resistor 220 is 50 Ohms.

In the second exemplary embodiment 301, the feedback circuit 262 is coupled to the output 322 of the resistor 220 and to the input 202 of the amplifier 290 and is configured to provide a feedback signal to the amplifier 290. The feedback circuit 262 enables the output resistance $R_{out}$ at the output 322 of the resistor 220 (e.g., at the output port 210) to exceed the resistance $R_A$ of the resistor 220. For example, the feedback circuit 262 may affect the output impedance so that the ratio of voltage to current at the output port 210 is $R_{out}$, where $R_{out}$ is larger than $R_A$. If a 50 Ohm load (e.g., a headphone speaker) is applied to the output port 210, impedance matching is achieved when the output impedance $R_{out}$ (e.g., an emulated resistance of the resistor 220) is 50 Ohms and the actual resistance $R_A$ of the resistor 220 is less than 50 Ohms.

Because the feedback circuit 262 of the second exemplary embodiment 301 enables the output resistance $R_{out}$ to be larger than the resistance $R_A$ of the resistor 220, impedance matching may be achieved with reduced voltage drop and power dissipation across the resistor 220 as compared to the first exemplary embodiment 300 without the feedback circuit 262. In implementations where the feedback circuit 262 is adjustable, the output impedance $R_{out}$ may be adjusted without adjusting the resistor 220, such as described in further detail with respect to FIG. 4.

Figure 4:
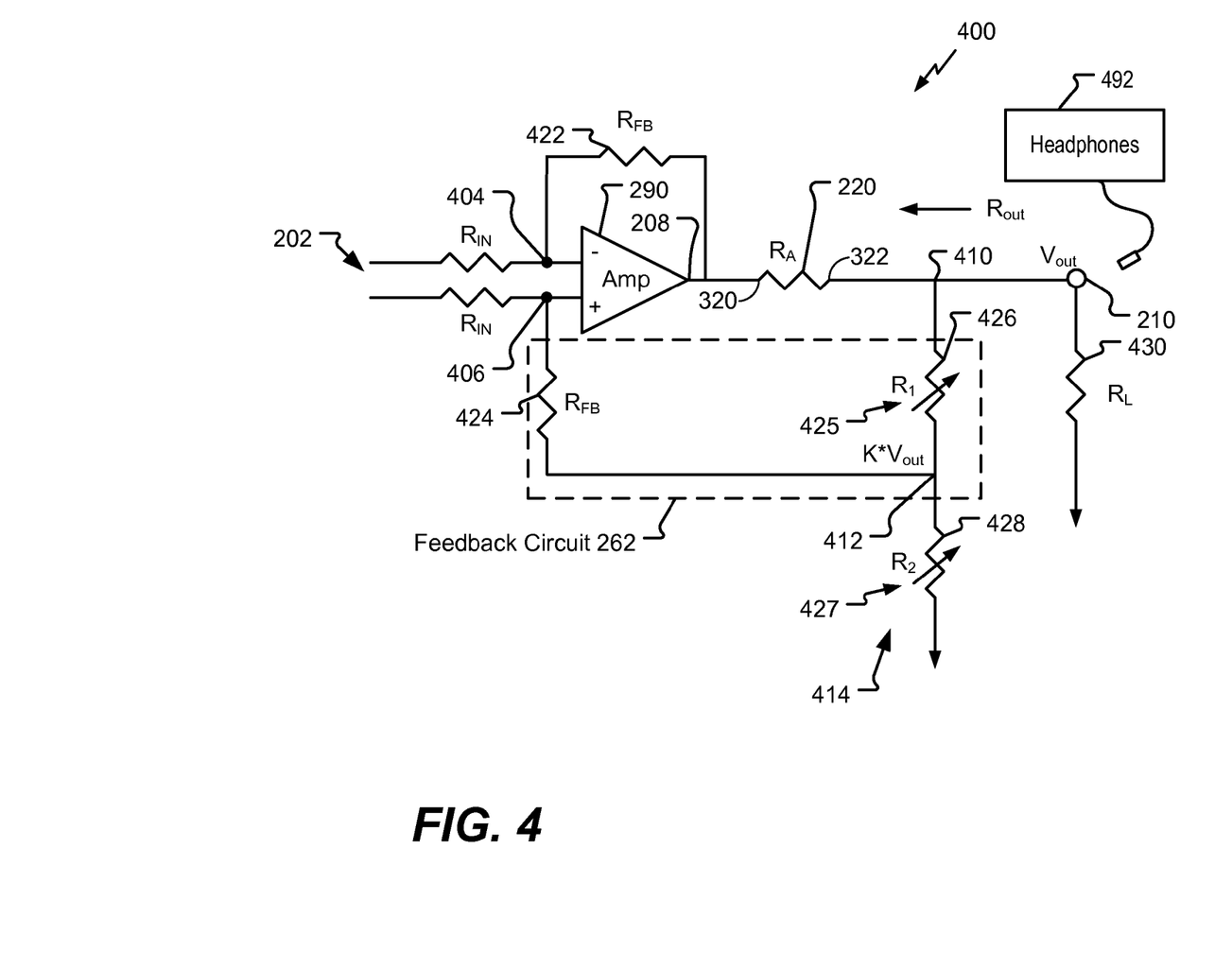
FIG. 4 shows a block diagram of another exemplary embodiment of components including a feedback circuit for increased output resistance that may be included in the wireless device of FIG. 1.

FIG. 4 illustrates an exemplary embodiment of an amplifier 400, such as an audio amplifier (e.g., a headphone power amplifier configured to provide a signal to a pair of headphones 492), that includes the amplifier 290, the resistor 220, and the feedback circuit 262. The feedback circuit 262 causes an effective output resistance at the output 322 of the resistor 220 (e.g., at the output port 210) to exceed a resistance of the resistor 220 via positive feedback. For example, a load device 430 may represent a speaker, such as one or more speakers in the pair of headphones 492, that is coupled to the output 322 of the resistor 220 via the output port 210.

The amplifier 290 may include an operational amplifier (opamp) having a first input 406 and a second input 404. A first feedback resistor 424 (e.g., a resistor having resistance $R_{FB}$) is coupled to the first input 406. A second feedback resistor 422 is coupled to the second input 404 and to the output 208. The resistance of the second feedback resistor 422 may substantially match the resistance of the first feedback resistor 424 (e.g., $R_{FB}$). The inputs 404 and 406 may be coupled to the amplifier input 202 (e.g., a differential signal input) via input resistances ($R_{IN}$).

The feedback circuit 262 includes an adjustable component that is programmable to enable the effective resistance of the series resistor 220 to dynamically match a load (e.g., the load device 430) at the output 322 of the series resistor 220 (e.g., at the output port 210). As a non-limiting example, the amplifier 400 may be a headphone power amplifier (e.g., an audio amplifier configured to provide an amplified audio signal to the output port 210 to drive speakers in headphones that may be coupled to the output port 210). Because various types of headphones or speakers may be coupled to the output port 210, an output impedance of the amplifier 400 may be adjusted or "tuned" to substantially match headphone or speaker impedances. For example, the amplifier 400 may be configurable to have an output impedance selected from several output voltages that range from 1 Ohm to 120 Ohms.

As illustrated, the feedback circuit 262 includes a first component 425 of a voltage divider 414, such as a first resistor 426, that is coupled via a node 410 to the output 322 of the resistor 220. The voltage divider 414 further includes a second component 427, such as a second resistor 428, coupled via a reference node 412 to the first component 425. The voltage divider 414 is configured to generate a reference voltage at a reference node 412. The reference node 412 is coupled via the first feedback resistor 424 to the first input 406 of the amplifier 290. Although the voltage divider 414 is illustrated as including the first resistor 426 and the second resistor 428, in other implementations the voltage divider 414 may include one or more other impedance components. For example, at least one of the first component 425 or the second component 427 may include one or more impedance elements, such as one or more capacitors, one or more inductors, or a combination thereof.

A first resistance $R_1$ of the first resistor 426 and/or a second resistance $R_2$ of the second resistor 428 of the voltage divider 414 may be adjustable, such as by including one or more switches that are controllable to increase or decrease a number of resistors that form the first resistance $R_1$ and/or to increase or decrease a number of resistors that form the second resistance $R_2$. The one or more switches may be responsive to control signals, such as from a processor or controller of the wireless device 110.

An output resistance $R_{out}$ of the audio amplifier 400 may be determined by applying a voltage $V_{out}$ to the output port 210 and measuring a resulting current at the output port 210. Applying $V_{out}$ to the output port 210 results in a reference voltage of $K*V_{out}$ at the reference node 412, where K has a value of $R_2/(R_1+R_2)$ (i.e., K is less than 1). In response to the voltage $K*V_{out}$ at the reference node 412, the amplifier 290 operates to bias the output 208 at the voltage $K*V_{out}$. A resulting current through the series resistor 220 based on the voltage difference $V_{out}-(K*V_{out})$ across the series resistor 220 may be expressed as $(1-K)*V_{out}/R_A$, which is reduced as compared to a conventional amplifier having its inputs at a virtual ground (e.g., current=$V_{out}/R_A$). The reduced current through the series resistor 220 indicates an effective output resistance $R_{out}=R_A/(1-K)$. The effective output resistance $R_{out}$ is larger than $R_A$.

The effective output resistance $R_{out}$ being larger than $R_A$ enables reduction of distortion at the output 322 of the resistor 220 (e.g., at the output port 210) by matching $R_{out}$ to the resistance $R_L$ of the load device 430 using a series resistor 220 with a resistance $R_A$ that is smaller than $R_L$. The smaller resistance $R_A$ of the series resistor 220 increases a voltage range at the output port 210 and reduces power loss due to the series resistor 220. In addition, the feedback circuit 262 may be programmable (e.g., by adjusting $R_1$ and/or $R_2$) to dynamically match a load (e.g., $R_L$) of the audio amplifier 400.

Figure 5:
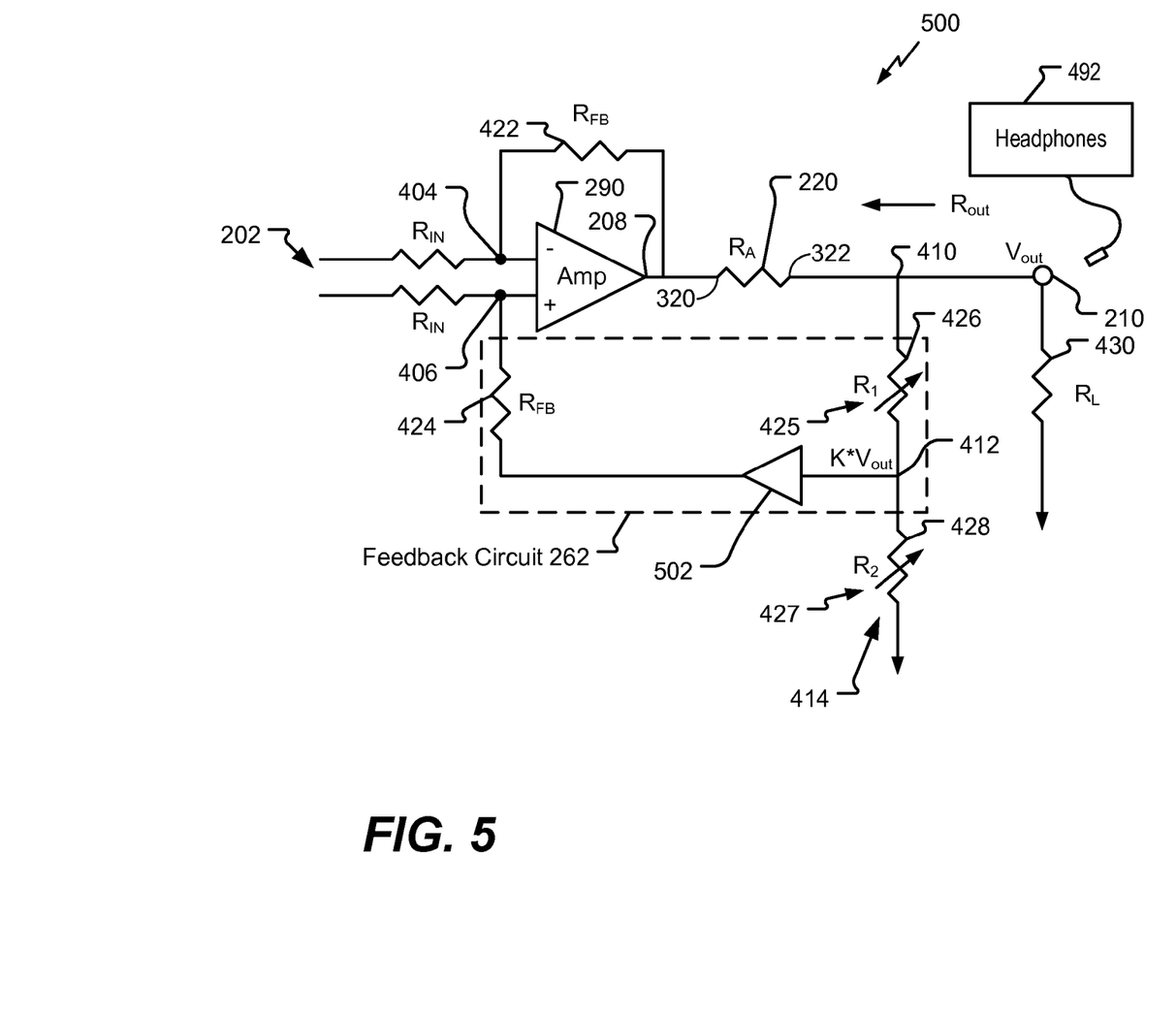
FIG. 5 shows a block diagram of another exemplary embodiment of components including a feedback circuit for increased output resistance that may be included in the wireless device of FIG. 1.

FIG. 5 illustrates another exemplary embodiment of an amplifier 500, such as an audio amplifier (e.g., a headphone power amplifier), that includes the amplifier 290, the resistor 220, and the feedback circuit 262. The feedback circuit 262 includes an amplifier 502, such as a unity-gain buffer amplifier, having an input coupled to the reference node 412 and an output coupled to the first feedback resistor 424.

The amplifier 502 inserts a large impedance along the current path from the first resistor 426 of the voltage divider 414 to the first feedback resistor 424 and the input resistance ($R_{IN}$). The amplifier 502 enables the amplifier 500 to use larger resistance values of the resistors R1 426 and R2 428 as compared to resistance values of the first resistor 426 and the second resistor 428 in the amplifier 400 of FIG. 4 without introducing performance degradation due to increased current along the feedback circuit 262. Larger resistance values of the first resistor 426 and the second resistor 428 may increase stability and reduce current consumption of the amplifier 500.

Figure 6:
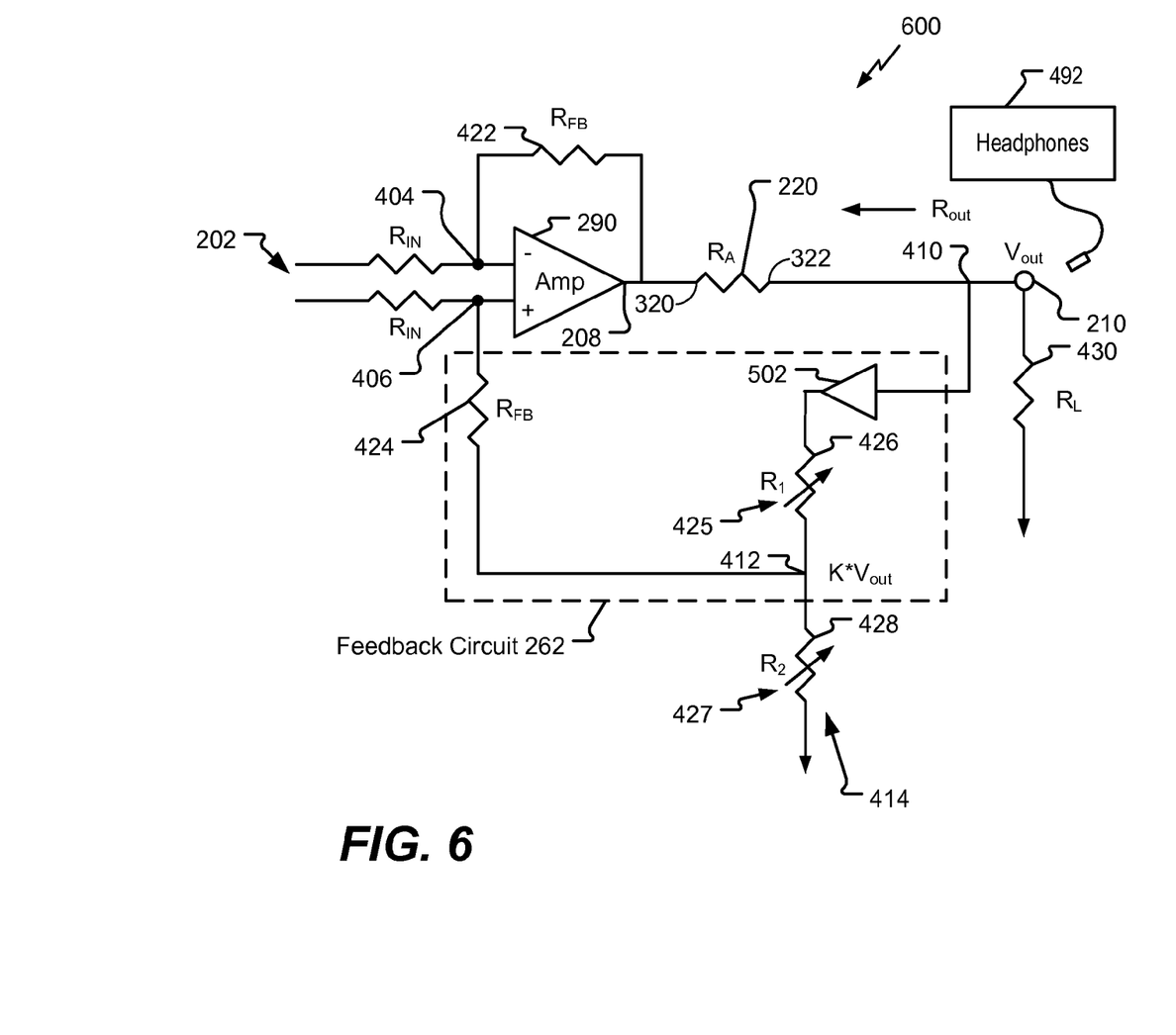
FIG. 6 shows a block diagram of another exemplary embodiment of components including a feedback circuit for increased output resistance that may be included in the wireless device of FIG. 1.

FIG. 6 illustrates another exemplary embodiment of an amplifier 600, such as an audio amplifier (e.g., a headphone power amplifier), that includes the amplifier 290, the resistor 220, and the feedback circuit 262. The feedback circuit 262 includes the amplifier 502 of FIG. 5, such as a unity-gain buffer amplifier, having an input coupled via the node 410 to the output port 210 and an output coupled to the first resistor 426 of the voltage divider 414.

The amplifier 502 inserts a large impedance along the current path from the node 410 to the first feedback resistor 424 and the input resistance ($R_{IN}$). The amplifier 502 enables the amplifier 600 to use larger resistance values of the first resistor 426 and the second resistor 428 as compared to resistance values of the first resistor 426 and the second resistor 428 in the amplifier 400 of FIG. 4 without introducing performance degradation due to increased current along the feedback circuit 262. Larger resistance values of the first resistor 426 and the second resistor 428 may increase stability and reduce current consumption of the amplifier 600.

Figure 7:
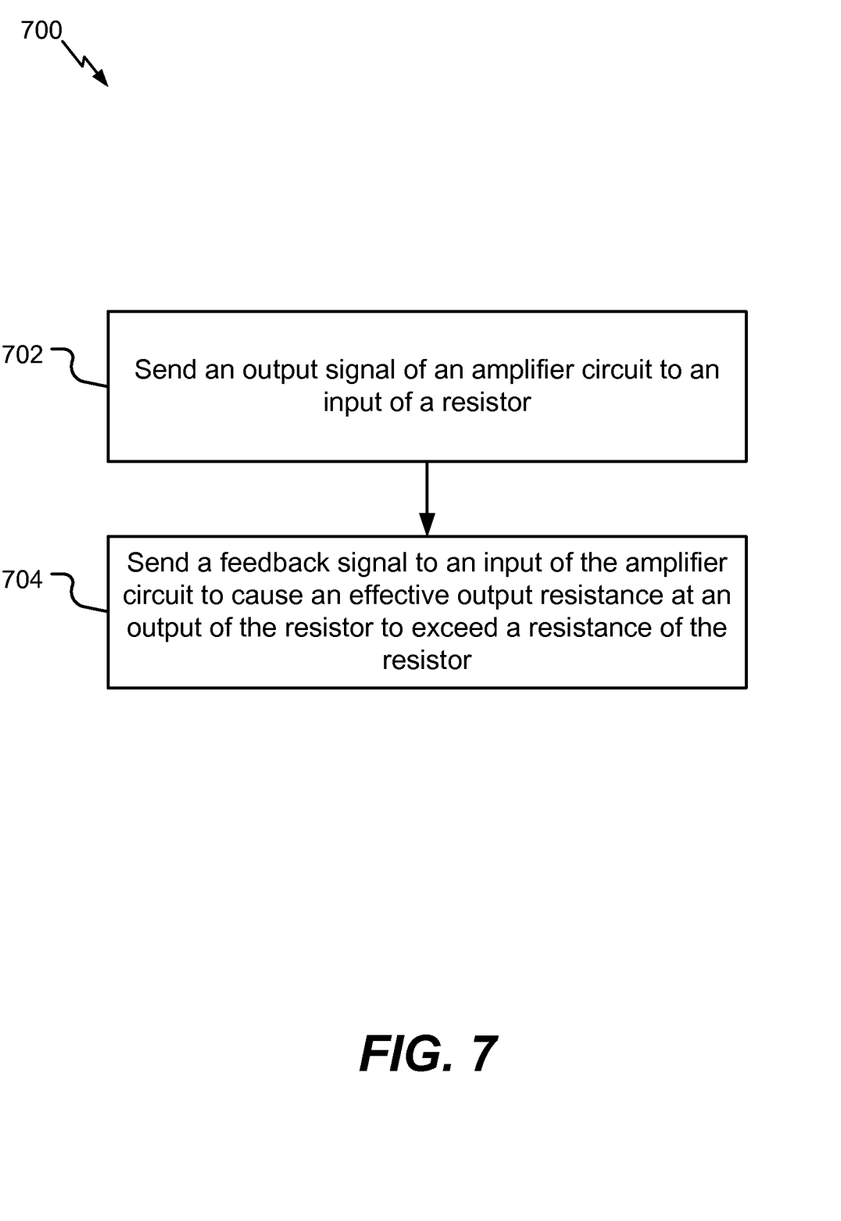
FIG. 7 illustrates a flowchart of a method that may be performed by the wireless device of FIG. 1.

An exemplary method 700 that may be performed in the wireless device 110 of FIG. 1 is shown in FIG. 7. The method 700 may include sending an output signal of an amplifier to an input of a resistor, at 702. For example, the amplifier 290 of FIGS. 2-6 sends an amplified output signal to the input 320 of the resistor 220.

The method 700 may include sending a feedback signal to an input of the amplifier to cause an effective output resistance at the output of the resistor to exceed the resistance of the resistor, at 704. For example, the feedback circuit 262 of FIGS. 2-6 causes the output resistance at the output 322 of the resistor 220 to exceed the resistance of the resistor 220 by sending a feedback signal based on the reference voltage $K^*V_{out}$, where $K^*V_{out}$ is generated at the reference node 412 of FIGS. 4-6.

The method 700 may also include dividing an output voltage to generate the reference voltage. The feedback signal may be based on the reference voltage. For example, the voltage divider 414 of FIGS. 4-6 may divide the output voltage $V_{out}$ to generate the reference voltage $K^*V_{out}$ at the reference node 412.

By causing an effective output resistance to exceed the resistance of the resistor, load matching may be achieved without an increased voltage drop and power loss associated with using a larger resistor at the output of the amplifier circuit.

In conjunction with the described embodiments, an apparatus includes means for amplifying. For example, the means for amplifying may include the amplifier 290 of FIGS. 2-6, one or more other devices, circuits, or any combination thereof.

The apparatus may include means for resisting current flow. The means for resisting has as input coupled to an output of the means for amplifying. For example, the means for resisting may include the resistor 220 of FIGS. 2-6, one or more other devices, circuits, or any combination thereof.

The apparatus may include means for biasing an input of the means for amplifying. For example, the means for biasing may include the feedback circuit 262 of FIGS. 2-6, one or more other devices, circuits, or any combination thereof.

The means for biasing may include at least a portion of a means for generating a reference voltage. The means for generating may be coupled to the output of the means for resisting. For example, the means for generating a reference voltage may include the voltage divider 414 of FIGS. 4-6, one or more other devices, circuits, or any combination thereof.

The means for amplifying, the means for resisting, and the means for biasing may be included in means for amplifying an audio signal, such as the audio amplifier 200 of FIG. 2, the amplifier 301 of FIG. 3, the amplifier 400 of FIG. 4, the amplifier 500 of FIG. 5, the amplifier 600 of FIG. 6, one or more other devices, circuits, or any combination thereof.

The means for biasing may include means for modifying an effective output resistance at the output of the means for resisting. For example, the means for modifying may include the first resistor 426 of FIGS. 4-6, the second resistor 428 FIGS. 4-6, the voltage divider 414 of FIGS. 4-6, one or more other devices, circuits, or any combination thereof.

An output of the means for generating may be coupled, via another means for resisting current flow, to the input of the means for amplifying. For example, the other means for resisting may correspond to the first feedback resistor 424 of FIGS. 4-6.

The apparatus may include third means for resisting current flow coupled to the means for amplifying. For example, the third means for resisting current flow may include the second feedback resistor 422 of FIGS. 4-6.

The apparatus may be incorporated in an amplifier, such as depicted in FIGS. 2-6. Using the means for biasing can enable the amplifier to provide a larger output resistance for load matching without the increased voltage drop and power loss associated with using a larger resistor.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a resistor having an input and an output, the input coupled to an output of an amplifier;
a feedback circuit coupled to the output of the resistor and to an input of the amplifier, the feedback circuit comprising a first component of a voltage divider and a first feedback resistor, the first component having an input coupled to the output of the resistor and an output coupled to an input of the first feedback resistor;
a second feedback resistor coupled to the output of the amplifier and to a second input of the amplifier; and
the voltage divider including the first component, a second component, and a reference node, the first component coupled via the reference node to the second component, the reference node coupled to the output of the first component, an input of the second component, and the input of the first feedback resistor, the voltage divider configured to divide an input voltage at the input of the first component to generate a reference voltage, the reference voltage based on a product of the input voltage and a first value, the first value based on a quotient of a second resistance of the second component by a sum of a first resistance of the first component and the second resistance of the second component.

2. The apparatus of claim 1, wherein the resistor, the feedback circuit, and the second feedback resistor are included in an audio amplifier, the audio amplifier configured to connect to a headphone.

3. The apparatus of claim 1, wherein the resistor, the feedback circuit, and the second feedback resistor are included in an audio amplifier, the audio amplifier included in a wireless device.

4. The apparatus of claim 1, wherein the first component is adjustable and configured to cause an effective output resistance at the output of the resistor to dynamically match a load.

5. The apparatus of claim 1, the first component including a first resistor of the voltage divider, the second component including a second resistor of the voltage divider, and the amplifier including an operational amplifier.

6. The apparatus of claim 1, wherein a first resistance of the first feedback resistor substantially matches a second resistance of the second feedback resistor, and wherein an effective output resistance at the output of the resistor is greater than a resistance of the resistor.

7. The apparatus of claim 5, the feedback circuit further including another amplifier having an input coupled to the reference node and to the first resistor of the voltage divider and having an output coupled to the first feedback resistor.

8. The apparatus of claim 5, the feedback circuit further including a unity-gain buffer amplifier having an input coupled to the output of the resistor and having an output coupled to the first resistor of the voltage divider.

9. An apparatus comprising:
means for amplifying an audio signal;
means for resisting current flow, the means for resisting having an input coupled to an output of the means for amplifying;
means for biasing an input of the means for amplifying, the means for biasing including second means for resisting current flow and at least a portion of means for generating a reference voltage, the means for biasing coupled to an output of the means for resisting, the means for generating having an input coupled to the output of the means for resisting and an output coupled to an input of the second means for resisting, the second means for resisting having an output coupled to the input of the means for amplifying;
third means for resisting current flow coupled to the output of the means for amplifying and to a second input of the means for amplifying; and
the means for generating the reference voltage including fourth means for resisting current flow, fifth means for resisting current flow, and a reference node, the fourth means for resisting coupled via the reference node to the fifth means for resisting, the reference node coupled to an output of the fourth means for resisting, an input of the fifth means for resisting, and the input of the second means for resisting, the means for generating the reference voltage configured to divide an input voltage at an input of the fourth means for resisting to generate the reference voltage, the reference voltage based on a product of the input voltage and a first value, the first value based on a quotient of a second resistance of the fifth means for resisting by a sum of a first resistance of the fourth means for resisting and the fifth means for resisting.

10. The apparatus of claim 9, the means for biasing including means for modifying an effective output resistance at the output of the means for resisting.

11. The apparatus of claim 9, the means for generating coupled to the output of the means for resisting, the means for generating including means for adjusting the reference voltage.

12. A method comprising:
receiving an analog audio signal at an amplifier;
sending an output signal of the amplifier to an input of a resistor;
sending a feedback signal from an output of the resistor, via a first component of a voltage divider, a reference node of the voltage divider, and a first feedback resistor, to an input of the amplifier to cause an effective output resistance at the output of the resistor to exceed a resistance of the resistor, wherein the reference node is coupled to an output of the first component, the input of a second component of the voltage divider, and an input of the first feedback resistor, wherein the first component is coupled via the reference node to the second component, and
wherein sending the feedback single includes dividing, by the voltage divider, an output voltage of the feedback signal to generate a reference voltage based on multiplying the output voltage by a second resistance of the second component and dividing the product of the output voltage and the second resistance by a sum of a first resistance of the first component and the second resistance; and
sending a second feedback signal from an output of the amplifier via a second feedback resistor to a second input of the amplifier.

13. The apparatus of claim 1, wherein the amplifier includes an operational amplifier, wherein the first component comprises a first adjustable resistor of the voltage divider and the second component comprises a second adjustable resistor of the voltage divider, wherein an output of the second adjustable resistor is coupled to ground, wherein the second resistor is independent of the feedback circuit, and wherein a first resistance of the first feedback resistor substantially matches a second resistance of the second feedback resistor.

14. The apparatus of claim 1, wherein the resistor is coupled to and configured to provide an amplified audio signal to an output port of an audio amplifier.

15. The apparatus of claim 1, wherein the input of the amplifier and the second input of the amplifier are configured to receive a differential input signal, and wherein the input of the amplifier is configured to receive the differential input signal via a first input resistor, and wherein the second input of the amplifier is configured to receive the differential input signal via a second input resistor.

16. The apparatus of claim 1, wherein the output of the resistor and the feedback circuit are directly connected to an output port of an audio amplifier.

17. The apparatus of claim 1, further comprising the amplifier, the amplifier configured to amplify an analog audio signal, wherein the voltage divider is configured to divide, independent of current, the input voltage.

18. The apparatus of claim 1, the feedback circuit further including a second amplifier configured to amplify a feedback signal, the second amplifier coupled to first component of the voltage divider.

* * * * *